United States Patent
Ryu et al.

(10) Patent No.: US 10,600,947 B2
(45) Date of Patent: Mar. 24, 2020

(54) THERMOELECTRIC MATERIALS, AND THERMOELECTRIC ELEMENT AND THERMOELECTRIC MODULE COMPRISING THE SAME

(71) Applicants: LG ELECTRONICS INC., Yeoui-daero, Yeongdeungpo-gu, Seoul (KR); UNIVERSITY-INDUSTRY COOPERATION GROUP OF KYUNG HEE UNIVERSITY, Deogyeong-daero, Giheung-gu, Yongin-si, Gyeonggi-do (KR)

(72) Inventors: Byunggil Ryu, Seoul (KR); Jongsoo Rhyee, Hwaseong-si (KR); Jinhee Kim, Suwon-si (KR)

(73) Assignees: LG ELECTRONICS INC., Seoul (KR); UNIVERSITY-INDUSTRY COOPERATION GROUP OF KYUNG HEE UNIVERSITY, Yongin-si, Gyeonggi-do (KR)

(*) Notice: Subject to any disclaimer, the term of this patent is extended or adjusted under 35 U.S.C. 154(b) by 291 days.

(21) Appl. No.: 15/566,469

(22) PCT Filed: Apr. 12, 2016

(86) PCT No.: PCT/KR2016/003815
§ 371 (c)(1),
(2) Date: Oct. 13, 2017

(87) PCT Pub. No.: WO2016/167525
PCT Pub. Date: Oct. 20, 2016

(65) Prior Publication Data
US 2018/0083176 A1    Mar. 22, 2018

(30) Foreign Application Priority Data
Apr. 14, 2015 (KR) .................. 10-2015-0052387

(51) Int. Cl.
*H01L 35/18* (2006.01)
*H01L 35/16* (2006.01)
*H01L 35/32* (2006.01)

(52) U.S. Cl.
CPC .............. *H01L 35/18* (2013.01); *H01L 35/16* (2013.01); *H01L 35/32* (2013.01)

(58) Field of Classification Search
CPC ......... H01L 35/18; H01L 35/16; H01L 35/32; H01L 35/14
See application file for complete search history.

(56) References Cited

U.S. PATENT DOCUMENTS

| 5,318,743 A | 6/1994 | Takiai et al. |
| 6,743,973 B2 | 6/2004 | Hayashi et al. |

(Continued)

FOREIGN PATENT DOCUMENTS

| JP | 07505246 A | 6/1995 |
| JP | 2000106460 A | 4/2000 |

(Continued)

OTHER PUBLICATIONS

Deshpande et al. "Study on Transport Properties of Bi2Se3 Single Crystals Grown by Vapor Phase Technique", Jul. 6, 2016, Synthesis and Reactivity in Inorganic, Metal-Organic, and Nano-Metal Chemistry, pp. 1553-3182. ISSN:1553-3174 (Year: 2016).*

(Continued)

*Primary Examiner* — Susan D Leong
(74) *Attorney, Agent, or Firm* — Dentons US LLP (57) ABSTRACT

Highly efficient thermoelectric materials with an improved thermoelectric performance due to doping ions on a Bi—Se—Te based compound, and a thermoelectric element and a thermoelectric module including the same are disclosed. The thermoelectric materials include a compound expressed by Chemical Formula 1 or a compound expressed by Chemical Formula 2.

(Continued)

$(AB_2)_x(Bi_2Se_{2.7}Te_{0.3})_{1-x}$ <Chemical Formula 1>

In Chemical Formula 1, A is a divalent cation element, B is a monovalent anion element, A and B are different with each other, and x is in a range of $0.0 < x \leq 0.4$.

$(AB)_x(Bi_2Se_{2.7}Te_{0.3})_{1-x}$ <Chemical Formula 2>

In Chemical Formula 2, A is a monovalent cation element, B is a monovalent anion element, A and B are different with each other, and x is in a range of $0.0 < x \leq 0.4$.

11 Claims, 5 Drawing Sheets

(56) References Cited

U.S. PATENT DOCUMENTS

| | | | |
|---|---|---|---|
| 8,257,662 | B2 | 9/2012 | Jin et al. |
| 9,431,593 | B2 | 8/2016 | Kato et al. |
| 9,691,961 | B2 | 6/2017 | Kato et al. |
| 9,758,688 | B2 | 9/2017 | Iijima et al. |
| 2002/0100499 | A1 | 8/2002 | Hayashi et al. |
| 2005/0115601 | A1 | 6/2005 | Olsen et al. |
| 2011/0315182 | A1* | 12/2011 | Tajima ............ C22C 12/00 136/203 |
| 2013/0164165 | A1* | 6/2013 | Yeh ............ C01B 19/002 419/32 |
| 2013/0221290 | A1 | 8/2013 | Murai et al. |
| 2013/0298954 | A1 | 11/2013 | Ahn et al. |
| 2015/0075578 | A1 | 3/2015 | Kato et al. |
| 2015/0122303 | A1 | 5/2015 | Kato et al. |
| 2015/0275015 | A1 | 10/2015 | Iijima et al. |

FOREIGN PATENT DOCUMENTS

| | | |
|---|---|---|
| JP | 2000357821 A | 12/2000 |
| JP | 2002232026 A | 8/2002 |
| JP | 2003133597 A | 5/2003 |
| JP | 2004356272 A | 12/2004 |
| JP | 2005072391 A | 3/2005 |
| JP | 2006237460 A | 9/2006 |
| JP | 200713000 A | 1/2007 |
| JP | 2007165463 A | 6/2007 |
| JP | 2010109054 A | 5/2010 |
| JP | 2010232259 A | 10/2010 |
| JP | 2012104560 A | 5/2012 |
| JP | 2013236088 A | 11/2013 |
| JP | 2014022674 A | 2/2014 |
| KR | 10-2013-0031622 A | 3/2013 |
| KR | 10-2014-0065721 A | 5/2014 |
| KR | 10-2014-0139908 A | 12/2014 |
| WO | 2008020480 A1 | 2/2008 |
| WO | 2009031489 A1 | 3/2009 |
| WO | 2010114172 A1 | 10/2012 |
| WO | 2013129189 A1 | 9/2013 |
| WO | 2015019871 A1 | 2/2015 |
| WO | 2013161645 A1 | 12/2015 |
| WO | 2014007225 A1 | 6/2016 |
| WO | 2014046306 A1 | 8/2016 |

OTHER PUBLICATIONS

Lee et al. "Preparation and Thermoelectric Properties of n-Type Bi2Te2.7Se0.3:Dm",Journal of Electronic Materials, vol. 44, No. 6, Nov. 1, 2014, pp. 1579-1584.

* cited by examiner

THERMOELECTRIC MATERIALS, AND THERMOELECTRIC ELEMENT AND THERMOELECTRIC MODULE COMPRISING THE SAME

This application is a National Stage of International Application No. PCT/KR2016/003815, filed on Apr. 12, 2016, which claims the benefit of Korean Patent Application No. 10-2015-0052387, filed on Apr. 14, 2015, all of which are hereby incorporated by reference in their entirety for all purposes as if fully set forth herein.

TECHNICAL FIELD

The present disclosure relates to thermoelectric materials with an improved thermoelectric performance, and a thermoelectric element and a thermoelectric module comprising the same.

More particularly, thermoelectric materials with high Seebeck coefficient and electrical conductivity and low thermal conductivity, and a thermoelectric element and a thermoelectric module comprising the same are disclosed.

BACKGROUND

A thermoelectric effect refers to a phenomenon in which an electrical potential difference is generated between two contact points when both ends of two different metal wires are connected to form a closed circuit and a temperature difference is applied to the both ends.

The thermoelectric effect includes the Seebeck effect using an electromotive force generated from a temperature difference between both ends of materials and the Peltier effect performing cooling and heating by the electromotive force.

Thermoelectric materials are materials that use the Seebeck effect and the Peltier effect to convert thermal energy into electrical energy or convert electrical energy into thermal energy.

Recently, the thermoelectric materials have gained attention along with utilization of an energy harvesting technology that gathers energy wasted or consumed in everyday lives to recycle the energy as electric power.

Since waste heat may be utilized as an energy source when the Seebeck effect is used, the waste heat may be utilized in various fields such as an engine and an air exhauster of a vehicle, an incineration plant, and a medical device using human body heat.

In addition, the thermoelectric materials may be used in non-vibration, low-noise refrigerator, air conditioner, various types of micro-cooling systems, etc., that do not use a refrigerant gas when the Peltier effect is used. Particularly, when thermoelectric elements are attached to various types of memory elements, the elements may be maintained at a uniform and stable temperature while reducing the volumes of the elements, thereby improving the performance of the elements.

SUMMARY

The present disclosure relates to thermoelectric materials with high Seebeck coefficient and electrical conductivity and low thermal conductivity.

In addition, the present disclosure relates to a highly efficient thermoelectric element comprising the thermoelectric materials.

In addition, the present disclosure relates to a highly efficient thermoelectric module comprising the thermoelectric materials.

Thermoelectric materials according to an embodiment of the present invention include a compound expressed by Chemical Formula 1 below.

$(AB_2)_x(Bi_2Se_{2.7}Te_{0.3})_{1-x}$ <Chemical Formula 1>

In Chemical Formula 1,
A is a divalent cation element,
B is a monovalent anion element,
A and B are different with each other, and
x is in a range of $0.0 < x \leq 0.4$.

Thermoelectric materials according to another embodiment of the present invention include a compound expressed by Chemical Formula 2 below.

$(AB)_x(Bi_2Se_{2.7}Te_{0.3})_{1-x}$ <Chemical Formula 2>

In Chemical Formula 2,
A is a monovalent cation element,
B is a monovalent anion element,
A and B are different with each other, and
x is in a range of $0.0 < x \leq 0.4$.

Thermoelectric materials according to the present disclosure have high Seebeck coefficient and electrical conductivity and low thermal conductivity due to doping ions on a Bi—Se—Te based compound, thereby having an excellent dimensionless performance index.

In addition, a thermoelectric element and a thermoelectric module comprising the thermoelectric materials of the present disclosure have excellent thermoelectric performance.

Accordingly, the thermoelectric materials, and the thermoelectric element and the thermoelectric module comprising the same according to the present disclosure may be usefully used in a refrigerator, an air conditioner, cogeneration, thermoelectric nuclear power generation for military and aerospace uses, a micro-cooling system, etc.

BRIEF DESCRIPTION OF DRAWINGS

Embodiments will be described in detail with reference to the following drawings in which like reference numerals refer to like elements, and wherein.

DETAILED DESCRIPTION

The present disclosure relates to highly efficient thermoelectric materials with an improved thermoelectric performance, and a thermoelectric element and a thermoelectric module comprising the same.

The dimensionless performance index (ZT) defined by Equation 1 below is used as an index for measuring the performance of the thermoelectric materials.

$$ZT = \frac{S^2 \sigma T}{k} \qquad \text{\textlangle Equation 1\textrangle}$$

In Equation 1, ZT represents the dimensionless performance index, S represents the Seebeck coefficient, 6 represents electrical conductivity, T represents an absolute temperature, and k represents thermal conductivity.

To increase the dimensionless performance index (ZT), materials with high Seebeck coefficient and electrical conductivity, i.e. power factor ($S^2\sigma$), and low thermal conductivity are needed. However, the Seebeck coefficient and the electrical conductivity are in a trade-off relation.

Generally, an electron has to have heavy effective mass for the Seebeck coefficient to be high whereas the electron has to have light effective mass for the electrical conductivity to be high.

That is, since it is difficult to destroy the trade-off relation by controlling the effective mass of the electron, the trade-off relation acts as a limitation in improving the thermoelectric performance.

In addition, the Seebeck coefficient of the thermoelectric materials increases as degeneracy of energy bands is higher, and the electrical conductivity of the thermoelectric materials is higher as dispersibility of the energy bands is higher.

However, since the degeneracy of energy bands is higher as the dispersibility of the energy bands is lower in general thermoelectric materials, there is a limitation in improving the thermoelectric performance.

The present disclosure relates to highly efficient thermoelectric materials with high Seebeck coefficient and electrical conductivity and low thermal conductivity, and a thermoelectric element and a thermoelectric module comprising the same.

Figure 1:
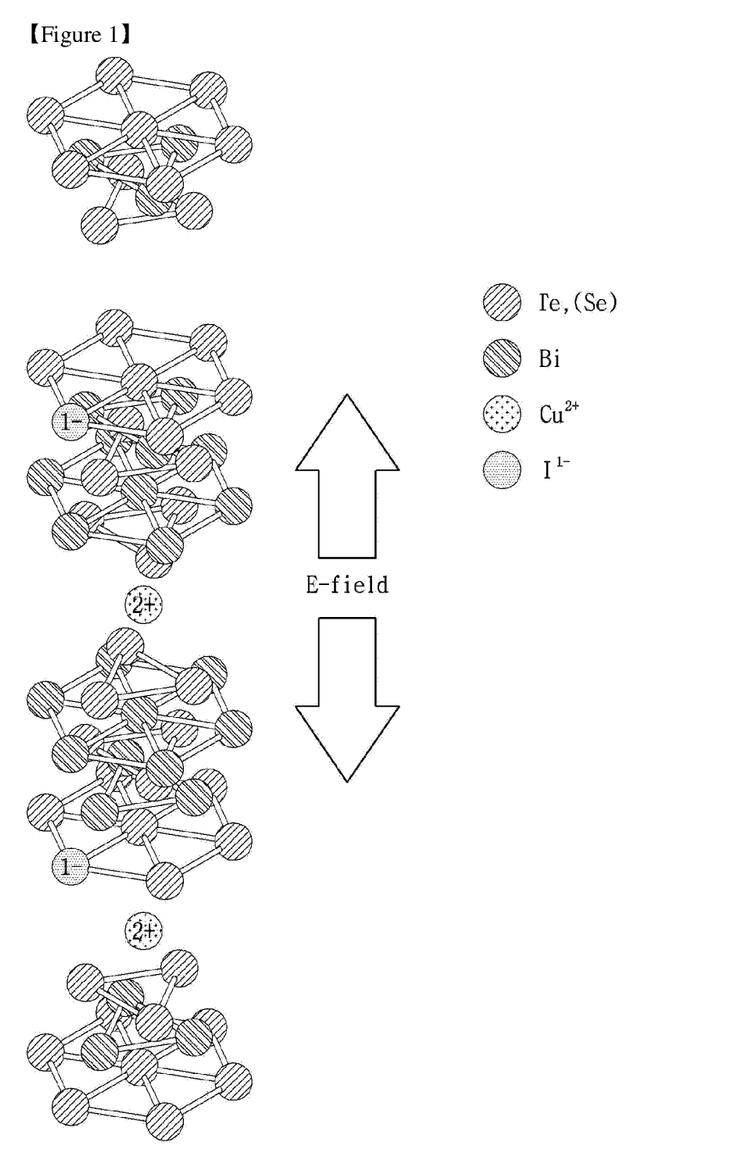
FIG. 1 is a view illustrating a crystal structure of thermoelectric materials according to an embodiment.

Referring to FIG. 1, thermoelectric materials according to the embodiment of the present invention may be formed by doping ions on a bismuth(Bi)-selenium(Se)-tellurium(Te) based compound.

Thermoelectric materials according to the embodiment of the present invention may include a compound expressed by Chemical Formula 1 below.

$(AB_2)_x(Bi_2Se_{2.7}Te_{0.3})_{1-x}$     \<Chemical Formula 1\>

In Chemical Formula 1, A may be a divalent cation element, B may be a monovalent anion element, A and B may be different with each other, and x may be in a range of $0.0 < x \leq 0.4$.

Thermoelectric materials according to another embodiment of the present invention may include a compound expressed by Chemical Formula 2 below.

$(AB)_x(Bi_2Se_{2.7}Te_{0.3})_{1-x}$     \<Chemical Formula 2\>

In Chemical Formula 2, A may be a monovalent cation element, B may be a monovalent anion element, A and B may be different with each other, and x may be in a range of $0.0 < x \leq 0.4$.

In Chemical Formula 1 or Chemical Formula 2, A may be a transition metal element. For example, A may include a copper family element in Group 11. Specifically, A may be any one selected from the group consisting of copper (Cu), silver (Ag), and compounds thereof. In addition, A may be any one selected from the group consisting of iron (Fe), manganese (Mn), cobalt (Co), chromium (Cr), vanadium (V), niobium (Nb), and compounds thereof but is not limited thereto.

In Chemical Formula 1 or Chemical Formula 2, B may include a halogen family element in Group 17. Specifically, B may be any one selected from the group consisting of iodine (I), bromine (Br), chlorine (Cl), and compounds thereof but is not limited thereto.

A Bi—Se—Te based compound according to Chemical Formula 1 or Chemical Formula 2 may have a layered structure including a layer formed of a planar structure. That is, a compound according to Chemical Formula 1 or Chemical Formula 2 may have a layered structure including a plurality of layers.

The planar structure may include any one selected from the group consisting of Te, Se, Bi, and compounds thereof.

The layered structure may include at least one first layer including Te or Se and at least one second layer including Bi. A molar ratio of Te:Se in the first layer may be 1:0 or 0:1. For example, the molar ratio of Te:Se in the first layer may be 1:9 or 9:1.

The second layer may be disposed on at least one portion of an upper portion and a lower portion of the first layer. For example, the second layer may be disposed on the upper portion or the lower portion of the first layer. Or, the second layer may be disposed on the upper portion and the lower portion of the first layer.

The cation element A in Chemical Formula 1 or Chemical Formula 2 may be inserted between the first layers. Specifically, A may be inserted between two first layers consisting of Te or Se as a dopant. For example, the cation element A may be inserted between the first layers in a sandwich form. Accordingly, the thermal conductivity of the compound according to Chemical Formula 1 or Chemical Formula 2 may be lowered than that of a Bi—Se—Te based compound.

The anion element B in Chemical Formula 1 or Chemical Formula 2 may substitute for Te or Se in the first layer. Specifically, B may partially substitute for Te or Se in the first layer as a dopant. For example, a portion of the Te element may be substituted with the anion element B. For example, a portion of the Se element may be substituted with the anion element B. Accordingly, the electrical conductivity of the compound according to Chemical Formula 1 or Chemical Formula 2 may be higher than that of the Bi—Se—Te based compound.

The planar structure may form a covalent bond between in-plane elements. Since Te or Se, which is an element in Group 16, is connected by a covalent bond in the first layer, a strong bond may be formed. Also, since Bi, which is an element in Group 15, is connected by a covalent bond in the second layer, a strong bond may be formed.

The first layer and the second layer may be disposed parallel to each other. That is, the first layer and the second layer may not cross each other. For example, the first layer and the second layer may be alternately disposed. For example, the first layers may be repetitively disposed.

In the layered structure, an interlayer bond between out-of-plane elements may form at least one bond of an ionic bond and a van der Waals bond.

The "out-of-plane" is not limited to a direction perpendicular to the "in-plane" and includes a relation between each of the elements disposed in different layers.

Specifically, a bond between the first layer and the second layer may form at least one bond of the ionic bond and the van der Waals bond.

For example, since the first layer including Te or Se and the second layer including Bi form the van der Waals bond, a weak bond may be formed.

Specifically, bonds between the first layers may form at least one bond of the ionic bond and the van der Waals bond.

For example, when the element A is inserted between the first layers and B partially substitutes for Te or Se in the first layer, the cation element A and the anion element B may form an ionic bond.

That is, in the compound expressed by Chemical Formula 1 or Chemical Formula 2, a bonding force between the in-plane elements may be strong due to forming the covalent bond therebetween, and the interlayer bond between the out-of-plane elements may have a weak bond due to forming at least one of the ionic bond and the van der Waals bond. Since the anisotropy of the crystal bonding forces decrease the thermal conductivity, the thermoelectric performance of the thermoelectric materials according to the embodiment may be improved.

In the compound of Chemical Formula 1, the molar ratio (x) of the $AB_2$ element may exceed 0 and be equal to or less than 0.4. Also, in the compound of Chemical Formula 1, the molar ratio (1-x) of the $Bi_2Se_{2.7}Te_{0.3}$ element may be equal to or greater than 0.6 and less than 1. In these ranges, the Seebeck coefficient is high due to the degeneracy of the energy bands being high, and the electrical conductivity is excellent due to the dispersibility of the energy bands also being high.

In the compound of Chemical Formula 2, the molar ratio (x) of the AB element may exceed 0 and be equal to or less than 0.4. Also, in the compound of Chemical Formula 2, the molar ratio (1-x) of the $Bi_2Se_{2.7}Te_{0.3}$ element may be equal to or greater than 0.6 and less than 1. In these ranges, the Seebeck coefficient is high due to the degeneracy of the energy bands being high, and the electrical conductivity is excellent due to the dispersibility of the energy bands also being high.

According to an embodiment of the present invention, a deficiency or a surplus of Te in terms of stoichiometry may be present. According to an embodiment of the present invention, a deficiency or a surplus of Se in terms of stoichiometry may be present. According to an embodiment of the present invention, the thermoelectric materials may further include doping impurities.

The thermoelectric materials according to an embodiment of the present invention may be formed by doping an ionic bonding compound on $Bi_2Se_{2.7}Te_{0.3}$.

The $Bi_2Se_{2.7}Te_{0.3}$ has a Bi element with heavy mass and has a layered structure forming the van der Waals bond, thereby having low thermal conductivity. Also, the $Bi_2Se_{2.7}Te_{0.3}$ has a high Seebeck coefficient due to the degeneracy of the energy bands being high. That is, the $Bi_2Se_{2.7}Te_{0.3}$ has the high Seebeck coefficient due to having degenerated bands.

However, since general thermoelectric materials including the $Bi_2Se_{2.7}Te_{0.3}$ has higher degeneracy of energy bands as the dispersibility of the energy bands is lower, it is difficult to simultaneously improve the electrical conductivity and the Seebeck coefficient.

The thermoelectric materials according to an embodiment of the present invention may be formed by doping an ionic bonding compound on $Bi_2Se_{2.7}Te_{0.3}$ to induce Rashba splitting by a crystal field such that the degeneracy of energy bands and the dispersibility of the energy bands are high, thereby providing materials in which the Seebeck coefficient and the electrical conductivity are simultaneously improved.

The ionic bonding compound may include at least one compound of $AB_2$ in Chemical Formula 1 and AB of Chemical Formula 2.

An ionic crystal field may be formed within a Bi—Se—Te based compound by doping the ionic bonding compound on the $Bi_2Se_{2.7}Te_{0.3}$, and highly efficient thermoelectric materials may be provided due to the ionic crystal field.

Specifically, the compound of Chemical Formula 1 or Chemical Formula 2 may be in an antiferroelectric state due to the electric field caused by A and B.

For example, since Chemical Formula 1 includes $AB_2$, and A is a divalent cation element and B is a monovalent anion element in Chemical Formula 1, an electric dipole is offset and spontaneous polarization of the whole compound may be 0.

For example, since Chemical Formula 2 includes AB, and A is a monovalent cation element and B is a monovalent anion element in Chemical Formula 2, an electric dipole is offset and spontaneous polarization of the whole compound may be 0.

That is, the compound of Chemical Formula 1 or Chemical Formula 2 may be an antiferroelectric substance having antiferroelectricity.

The compound expressed by Chemical Formula 1 or Chemical Formula 2 may generate a Rashba effect as the ionic crystal field is induced therein. The Rashba effect refers to a phenomenon in which an electron spin is polarized in a two-dimensional non-magnetic substance.

That is, the compound expressed by Chemical Formula 1 or Chemical Formula 2 may induce the Rashba splitting on the degenerated bands of the $Bi_2Se_{2.7}Te_{0.3}$, thereby providing thermoelectric materials having energy bands that are more degenerated than those of the $Bi_2Se_{2.7}Te_{0.3}$, i.e. having higher degeneracy of the energy bands. Also, thermoelectric materials having energy bands that are more dispersive than those of the $Bi_2Se_{2.7}Te_{0.3}$, i.e. having higher dispersibility of the energy bands may be provided.

For example, the compound expressed by Chemical Formula 1 or Chemical Formula 2 may generate a Dirac-like band.

Accordingly, the thermoelectric materials according to the embodiment may have high Seebeck coefficient due to the degeneracy of the energy bands being high and high electrical conductivity due to the dispersibility of the energy bands being high. Also, the thermoelectric materials according to the embodiment may have high electrical conductivity by the mobility being improved. In addition, the thermoelectric materials according to the embodiment may have high electrical conductivity by the current density being improved.

That is, the thermoelectric materials according to the embodiment may utilize the ionic crystal field to induce the Rashba splitting, thereby providing thermoelectric materials with a high power factor.

In addition, the compound expressed by Chemical Formula 1 or Chemical Formula 2 includes the Bi element with heavy mass and has the layered structure forming the van der Waals bond, thereby having low thermal conductivity.

Consequently, an embodiment of the present invention may provide highly efficient thermoelectric materials with an improved dimensionless performance index.

Hereinafter, an embodiment of the present invention will be described in more detail with reference to an example. The example is merely provided as an example for describing the embodiment of the present invention in more detail. Consequently, the present invention is not limited to the example.

EXAMPLE

After quantifying Bi, Se, Te, and cuprous iodide (CuI) corresponding to molar ratios, the quantified Bi, Se, Te, and CuI were put into a quartz tube, and the quartz tube was sealed in a vacuum state. After the sealed quartz tube was maintained at 650° C. to melt Bi, Se, Te, and CuI, a sample was slowly lowered at a speed of 3 mm/h to first crystallize a lower portion of the sample, and a single crystal of $(CuI)_{0.003}(Bi_2Se_{2.7}Te_{0.3})_{0.997}$ was grown.

FIGS. 2 to 6 are graphs illustrating results of measuring physical properties of the thermoelectric materials according to the embodiment.

Figure 2:
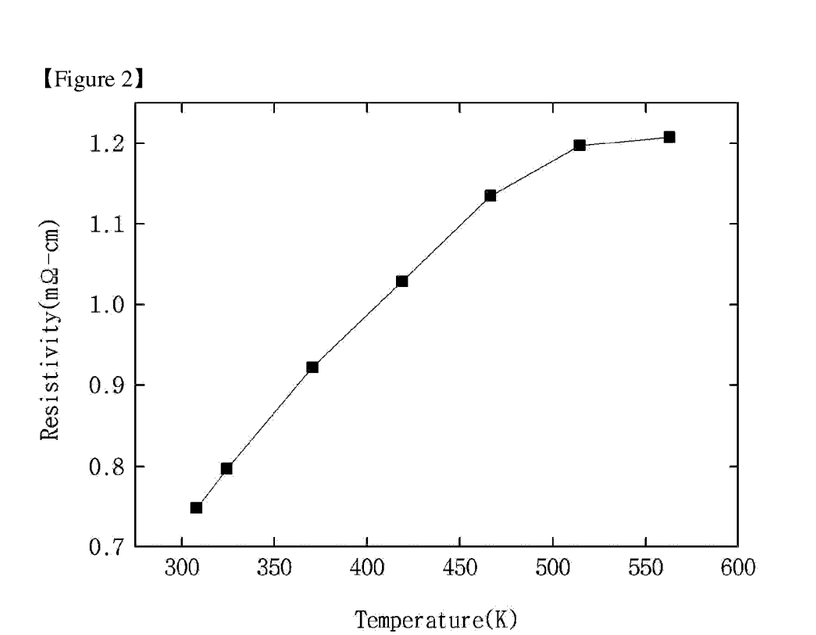
FIG. 2 is a graph illustrating a result of measuring resistivity of the thermoelectric materials according to the embodiment.

FIG. 2 is a graph illustrating a result of measuring resistivity of the thermoelectric materials according to the embodiment. The resistivity was measured in-plane. The electrical conductivity is a reciprocal of the resistivity ρ.

Referring to FIG. 2, the single crystal of $(CuI)_{0.003}(Bi_2Se_{2.7}Te_{0.3})_{0.997}$ has electrical conductivity of $10^3$ S/cm or higher at room temperature. The room temperature does not refer only to 298 K and may refer to a range of temperatures lower or higher than 300 K. For example, the room temperature may include temperatures ranging from 280 K to 320 K.

Metals generally have high electrical conductivity due to small electrical resistance.

It can be recognized that characteristics of a metal or a degenerated semiconductor are shown by doping ions in the embodiment. That is, it can be recognized that the electrical resistance decreases and the electrical conductivity increases as the temperature drops in the embodiment.

Figure 3:
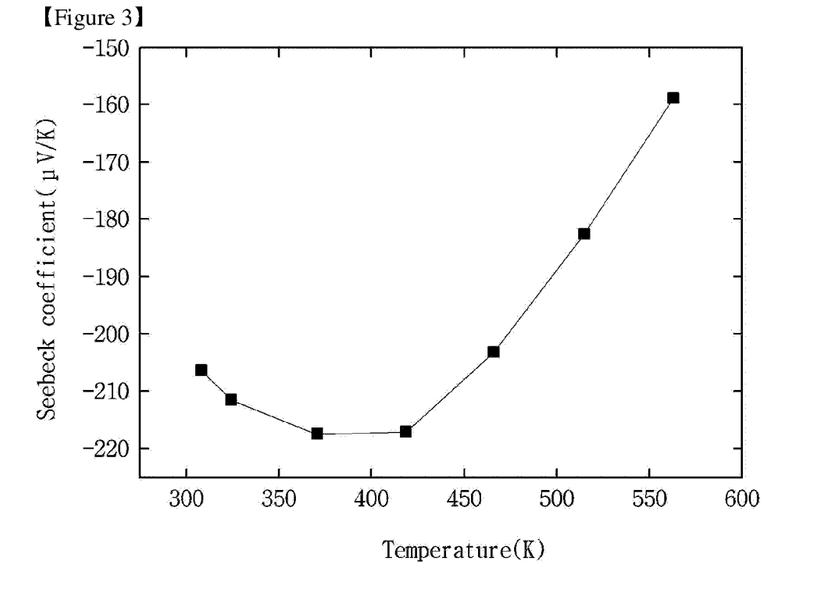
FIG. 3 is a graph illustrating a result of measuring the Seebeck coefficient of the thermoelectric materials according to the embodiment.

FIG. 3 is a graph illustrating a result of measuring the Seebeck coefficient of the thermoelectric materials according to the embodiment. The Seebeck coefficient was measured in-plane.

Referring to FIG. 3, since the Seebeck coefficients of the thermoelectric materials according to the embodiment are negative values, it can be recognized that the thermoelectric materials according to the embodiment are n-type thermoelectric materials. The maximum value of the Seebeck coefficient is approximately −220 μN/K. In the embodiment, it can be recognized that the Seebeck coefficient has increased by the doping of ions.

Figure 4:
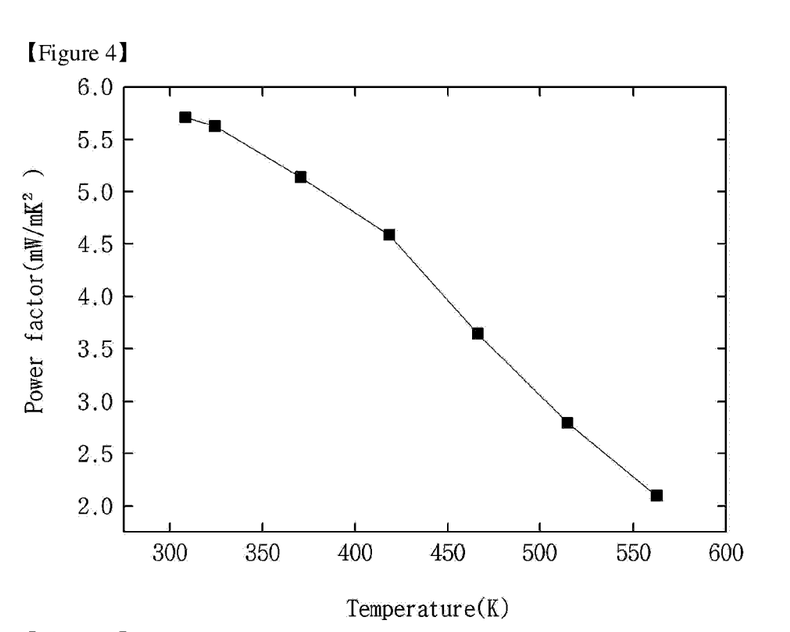
FIG. 4 is a graph illustrating a result of measuring a power factor of the thermoelectric materials according to the embodiment.

FIG. 4 is a graph illustrating a result of measuring a power factor of the thermoelectric materials according to the embodiment. The power factor was measured in-plane.

Referring to FIG. 4, it can be recognized that the power factor of the thermoelectric materials according to the embodiment has the maximum value at the room temperature. The power factor has an extremely large value of approximately 5.8 mW/mK$^2$ at the room temperature. Accordingly, the thermoelectric materials according to the embodiment may also be applied to a generator using heat at the room temperature or a body temperature close to the room temperature.

In addition, since a high power factor may be maintained in an extremely wide temperature range, a range of an operating temperature of the thermoelectric materials may be widened.

Figure 5:
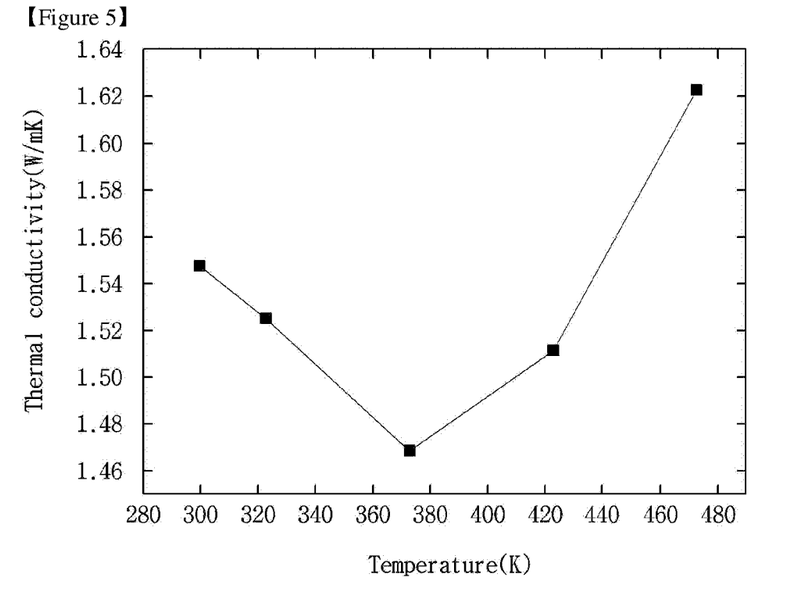
FIG. 5 is a graph illustrating a result of measuring thermal conductivity of the thermoelectric materials according to the embodiment.

FIG. 5 is a graph illustrating a result of measuring thermal conductivity of the thermoelectric materials according to the embodiment. The thermal conductivity was measured in-plane.

Referring to FIG. 5, the thermal conductivity of the thermoelectric materials according to the embodiment is approximately equal to or lower than 1.7 W/mK at the room temperature. The thermal conductivity is minimum at approximately 370 K and is approximately 1.55 W/mK at the room temperature.

In the thermoelectric materials according to the embodiment, a bonding force between the in-plane elements may be strong due to forming the covalent bond therebetween, and the interlayer bond between the out-of-plane elements may have a weak bond due to forming at least one of the ionic bond and the van der Waals bond. Since the anisotropy of the crystal bonding forces decrease the thermal conductivity, the thermoelectric materials according to the embodiment may have low thermal conductivity.

Figure 6:
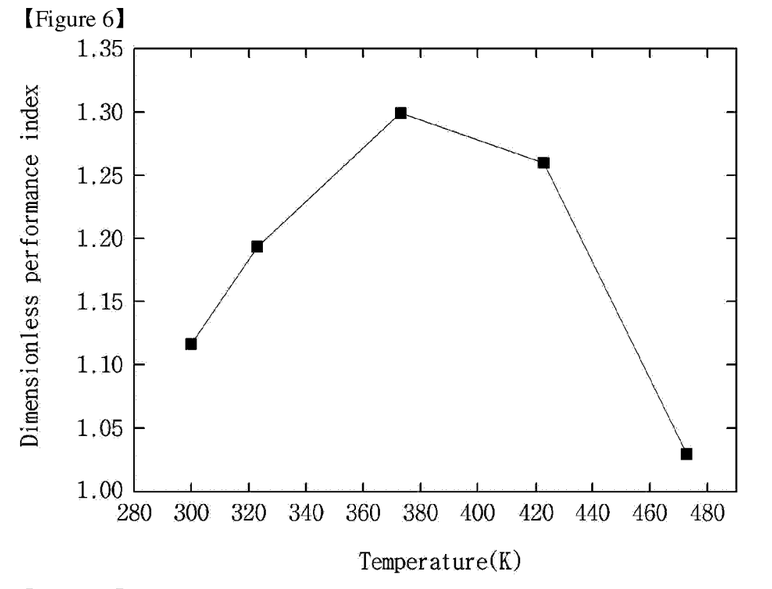
FIG. 6 is a graph illustrating a result of measuring a dimensionless performance index of the thermoelectric materials according to the embodiment.

FIG. 6 is a graph illustrating a result of measuring a dimensionless performance index of the thermoelectric materials according to the embodiment. The dimensionless performance index was measured in-plane.

Referring to FIG. 6, the thermoelectric materials according to the embodiment has a dimensionless performance index of approximately 1.0 or greater. Also, the maximum value of the dimensionless performance index of the thermoelectric materials according to the embodiment was measured to be approximately 1.3.

The n-type thermoelectric materials according to the embodiment has a dimensionless performance index of approximately 1.1 or greater at the room temperature. That is, the n-type thermoelectric materials according to the embodiment is formed by doping ions on a Bi—Se—Te based compound, thereby providing highly efficient thermoelectric materials with an improved thermoelectric performance.

Although a single crystal of the thermoelectric materials according to the embodiment was grown by a Bridgeman method, a method of growing the single crystal is not limited thereto.

That is, the thermoelectric materials according to the embodiment may have a multi-crystal structure or a single-crystal structure. Although examples of a method of synthesizing the multi-crystal structure or the single-crystal structure are shown below, the examples thereof are not limited thereto.

For example, a method of synthesizing thermoelectric materials having a single-crystal structure includes, 1) the Bridgeman method including steps of putting a predetermined ratio of material elements in a crucible, heating the crucible to a high temperature until the material elements are molten at end portions of the crucible, and slowly moving the high-temperature region to allow the whole sample to pass through the high-temperature region while locally melting the sample in order to grow a crystal; 2) a metal flux method including steps of putting a predetermined ratio of material elements and elements that provide an atmosphere in which the material elements may grow well to be crystals in a crucible and thermally treating the crucible at a high temperature to grow crystals; 3) an optical floating zone method including steps of forming a predetermined ratio of material elements in rod shapes, i.e., a seed rod and a feed rod, and focusing light of a lamp to one point to locally melt a sample at a high temperature and slowly raise the molten portion by the feed rod in order to grow crystals; 4) a vapor transport method including steps of putting a predetermined ratio of material elements at a lower portion of a quartz tube, and heating portions of the material elements while keeping an upper portion of the quartz tube at a low temperature to grow crystals by triggering a solid state reaction at the lower temperature as the material elements are vaporized; 5) and a Czochralski method, etc.

For example, a method of synthesizing thermoelectric materials having a multi-crystal structure includes, 1) a method (a method using an ampoule) including steps of putting a predetermined ratio of material elements in a quartz tube or an ampoule made of metal, sealing the quartz tube or the ampoule, and thermally treating the quartz tube or the ampoule; 2) an arc melting method including steps of putting a predetermined ratio of material elements in a chamber, and discharging an arc in an inert gas atmosphere to melt the material elements in order to make a sample; and 3) a solid state reaction method including steps of mixing a predetermined ratio of material powder well, firmly processing the powder, and thermally treating the powder, or thermally treating the mixed powder and then processing and sintering the mixed powder.

The embodiment of the present invention may provide a thermoelectric element by forming the thermoelectric materials by methods such as cut processing. The thermoelectric element according to the embodiment refers to a result of forming the thermoelectric materials in a predetermined shape. For example, the thermoelectric element may be in a rectangular parallelepiped shape or a cylindrical shape but the shape thereof is not limited thereto.

Figure 7:
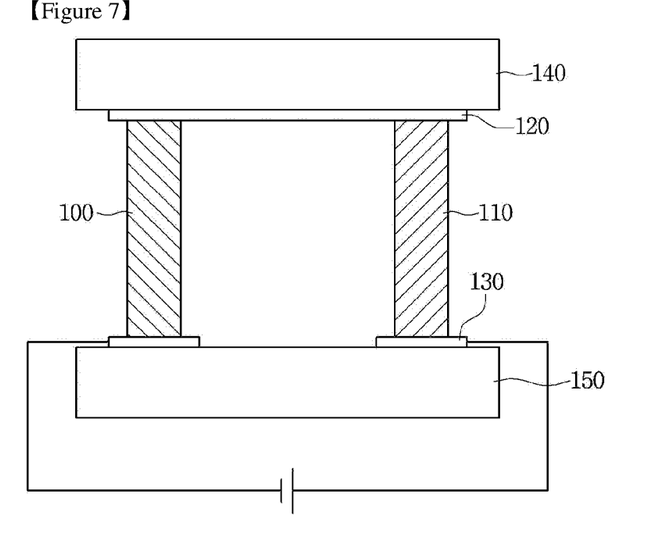
FIG. 7 is a view illustrating a plan view of a thermoelectric module according to the embodiment.
Figure 8:
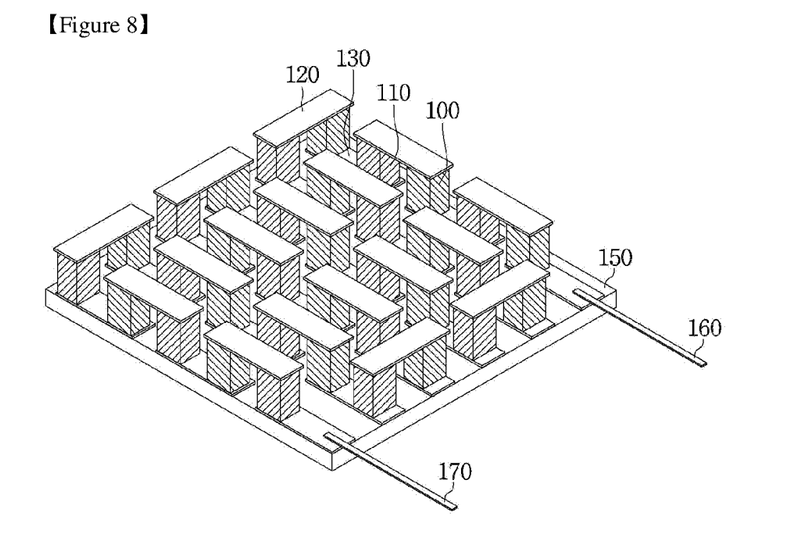
FIG. 8 is a view illustrating a side view of the thermoelectric module according to the embodiment.

FIGS. 7 and 8 are views illustrating a thermoelectric module according to an embodiment. The thermoelectric module according to the embodiment may include the thermoelectric element.

Referring to FIGS. 7 and 8, the thermoelectric module according to the embodiment may include a p-type thermoelectric element 100, an n-type thermoelectric element 110, a first electrode 120, a second electrode 130, a first substrate 140, and a second substrate 150.

Referring to FIG. 7, the thermoelectric module according to the embodiment may include the first substrate 140 and the second substrate 150 disposed parallel to each other.

In a case of a thermoelectric module for cooling, at least one substrate of the first substrate 140 and the second substrate 150 may be an insulating substrate. For example, at least one substrate of the first substrate 140 and the second substrate 150 may be an alumina ($Al_2O_3$) substrate. Specifically, the alumina substrate with a thickness of 30 mm to 50 mm may be used.

The first electrode 120 may be disposed on the first substrate 140, and the second electrode 130 may be disposed on the second substrate 150. Accordingly, the first electrode 120 and the second electrode 130 may be disposed parallel to each other.

At least one electrode of the first electrode 120 and the second electrode 130 may include at least one metal among Cu, Ag, nickel (Ni), Cr, aluminum (Al), molybdenum (Mo), gold (Au), titanium (Ti), and alloys thereof.

A thermoelectric element may be disposed between the first electrode 120 and the second electrode 130. The thermoelectric element may include the p-type thermoelectric element 100 and the n-type thermoelectric element 110.

For example, the first electrode 120 may be disposed to directly come in contact with the p-type thermoelectric element 100 and the n-type thermoelectric element 110. For example, the second electrode 130 may be disposed to directly come in contact with the p-type thermoelectric element 100 and the n-type thermoelectric element 110.

Accordingly, the first electrode 120 and the second electrode 130 may electrically connect the thermoelectric elements.

Referring to FIG. 8, the thermoelectric module according to the embodiment may include a plurality of p-type thermoelectric elements and a plurality of n-type thermoelectric elements. The p-type thermoelectric elements 100 and the n-type thermoelectric elements 110 may be alternately disposed.

At least one thermoelectric element of the p-type thermoelectric element 100 and the n-type thermoelectric element 110 may include the thermoelectric materials which are the compounds expressed by Chemical Formula 1 or Chemical Formula 2.

For example, the n-type thermoelectric element 110 may be formed by processing the thermoelectric materials which are the compounds expressed by Chemical Formula 1 or Chemical Formula 2.

One electrode of the first electrode 120 and the second electrode 130 may be exposed to a heat supply source. Or, one electrode of the first electrode 120 and the second electrode 130 may be electrically connected to a power supply source. For example, the second electrode 130 may be electrically connected to the power supply source by circuits 160 and 170.

Specifically, when a current is supplied to the thermoelectric module according to the embodiment via the circuits 160 and 170, the Peltier effect may be realized. More specifically, the thermoelectric module according to the embodiment may be used in a cooling system using the Peltier effect. For example, the thermoelectric module according to the embodiment may be usefully used in a kimchi refrigerator, a wine refrigerator, a cosmetic cooler, an air conditioner, a micro-cooling system, etc.

That is, the thermoelectric element may be coupled to an electrode to show the cooling effect by current application. Or, the thermoelectric element according to the embodiment may show the power generating effect by a temperature difference generated by a heat source.

Consequently, the thermoelectric materials according to the present invention, and the thermoelectric element and the thermoelectric module comprising the same may be used in a thermoelectric cooling system or a thermoelectric power generation system.

Thermoelectric materials according to the embodiment of the present invention have high Seebeck coefficient and electrical conductivity and low thermal conductivity due to doping ions on a Bi—Se—Te based compound, thereby having an excellent dimensionless performance index.

In addition, a thermoelectric element and a thermoelectric module comprising the thermoelectric materials of the embodiment of the present invention have excellent thermoelectric performance.

Accordingly, the thermoelectric materials, and the thermoelectric element and the thermoelectric module comprising the same according to the embodiment of the present invention may be usefully used in a refrigerator, an air conditioner, cogeneration, thermoelectric nuclear power generation for military and aerospace uses, a micro-cooling system, etc.

The characteristics, structures, effects, etc. described in the above embodiment are included in at least one embodiment of the present invention but is not limited to only one embodiment. Further, the characteristics, structures, effects, etc. exemplified in each embodiment may be practiced even in other embodiments by being combined or modified by those of ordinary skill in the art to which the embodiments pertain. Consequently, contents related to the combinations and the modifications should be construed as belonging to the scope of the present invention.

In addition, although the present invention has been described above with respect to the embodiments, the embodiments are merely examples and do not limit the present invention, and those of ordinary skill in the art to which the present invention pertains will understand that various unexemplified modifications and applications are possible within the scope not departing from essential characteristics of the embodiments. For example, each element shown in detail in the embodiments may be practiced by being modified. In addition, differences related to the modifications and the applications should be construed as belonging to the scope of the present invention defined in the accompanying claims.

The invention claimed is:

1. A thermoelectric material comprising a compound expressed by Chemical Formula 2:

$$(AB)_x(Bi_2Se_{2.7}Te_{0.3})_{1-x}, \text{ wherein:} \qquad \text{<Chemical Formula 2>}$$

A is a monovalent cation element;
B is a monovalent anion element;
A and B are different with each other; and
x is in a range of $0.0 < x \leq 0.4$.

2. The thermoelectric material according to claim 1, wherein the A is a transition metal element and B is a halogen family element.

3. The thermoelectric material according to claim 1, wherein A is any one selected from the group consisting of Cu, Ag, and compounds thereof.

4. The thermoelectric material according to claim 1, wherein B is any one selected from the group consisting of I, Br, Cl, and compounds thereof.

5. The thermoelectric material according to claim 1, wherein the compound is in a layered structure comprising a plurality of layers.

6. The thermoelectric material according to claim 1, wherein the compound comprises:
   at least one first layer comprising Te or Se;
   and at least one second layer comprising Bi which is disposed on at least one portion of an upper portion and a lower portion of the first layer.

7. The thermoelectric material according to claim 6, wherein the compound comprises at least two first layers, and the cation element A is inserted between the two first layers.

8. The thermoelectric material according to claim 7, wherein the anion element B substitutes for Te or Se in the first layer.

9. The thermoelectric material according to claim 1, wherein the compound has a single-crystal structure.

10. A thermoelectric element comprising the thermoelectric material according to claim 1.

11. A thermoelectric module comprising:
   a first electrode;
   a second electrode; and
   a thermoelectric element disposed between the first electrode and the second electrode,
   wherein the thermoelectric element comprises the thermoelectric material according to claim 1.

* * * * *